United States Patent
Park et al.

(10) Patent No.: US 11,454,612 B1
(45) Date of Patent: Sep. 27, 2022

(54) SYSTEM FOR INSPECTING EQUIPMENT AND MATERIALS FOR QUALITY

(71) Applicant: SMARTINSIDE AI Inc., Suwon-si (KR)

(72) Inventors: Seung Hee Park, Seongnam-si (KR); Han Sun Kim, Miryang-si (KR)

(73) Assignee: SMARTINSIDE AI Inc., Suwon-si (KR)

(*) Notice: Subject to any disclaimer, the term of this patent is extended or adjusted under 35 U.S.C. 154(b) by 0 days.

(21) Appl. No.: 17/687,566

(22) Filed: Mar. 4, 2022

(30) Foreign Application Priority Data

Mar. 11, 2021 (KR) .................. 10-2021-0031876

(51) Int. Cl.
   *G01N 27/83* (2006.01)
   *G01R 33/02* (2006.01)

(52) U.S. Cl.
   CPC ............. *G01N 27/83* (2013.01); *G01R 33/02* (2013.01)

(58) Field of Classification Search
   CPC .............................. G01N 27/83; G01R 33/02
   See application file for complete search history.

(56) References Cited

U.S. PATENT DOCUMENTS

| | | | | |
|---|---|---|---|---|
| 4,818,935 A * | 4/1989 | Takahashi | .......... | G01N 27/9013 324/242 |
| 10,883,965 B2 * | 1/2021 | Feng | .................. | G01N 29/2412 |
| 11,307,173 B1 * | 4/2022 | Uselton | ............. | G01N 27/9046 |

FOREIGN PATENT DOCUMENTS

| | | |
|---|---|---|
| KR | 10-0956163 B1 | 5/2010 |
| KR | 10-1679519 B1 | 11/2016 |
| KR | 10-2020-0087331 A | 7/2020 |

* cited by examiner

*Primary Examiner* — Reena Aurora
(74) *Attorney, Agent, or Firm* — Patent Office of Dr. Chung Park

(57) ABSTRACT

Disclosed herein is a system for inspecting equipment and materials for quality. The system for inspecting equipment and materials for quality includes: a magnetic sensor configured to generate a magnetic field in an inspection target object, and to detect magnetic flux density; and a quality inspection server configured to determine the presence of a defect, a portion where the detect is present, and the type of defect for the inspection target object based on magnetic flux density waveforms over a range from one end of the inspection target object to the other end thereof that are generated via signals detected by the magnetic sensor.

2 Claims, 3 Drawing Sheets

SYSTEM FOR INSPECTING EQUIPMENT AND MATERIALS FOR QUALITY

CROSS-REFERENCE TO RELATED APPLICATION

This application claims the benefit of Korean Patent Application No. 10-2021-0031876 filed on Mar. 11, 2021, which is hereby incorporated by reference herein in its entirety.

BACKGROUND

1. Technical Field

The present invention relates generally to a system for inspecting equipment and materials for quality, and more particularly to a system capable of determining the presence of a defect and the type of defect for equipment and materials based on the analysis of magnetic flux density characteristics.

2. Description of the Related Art

In construction sites, there are many temporary equipment and materials such as structures that are temporarily installed and then dismantled for main construction.

These temporary equipment and materials are temporarily used during a construction process and dismantled after installation, and may be reused in other construction sites. Furthermore, for this reason, a lot of deformation attributable to external force inevitably occurs in temporary equipment and materials.

In large-scale construction sites, large quantities of temporary equipment and materials are used, and it is not easy to manage such temporary equipment and materials.

Most temporary equipment and materials are composed of steel products. Defects occurring in these steel products may be classified into surface defects that appear on the surfaces thereof and internal defects that are present inside the products.

In general, surface defects appearing on steel products are detected by a human eye or a surface inspection device equipped with a camera or the like.

However, it is difficult to accurately detect internal defects or defects that are not detected with the naked eye or a camera, and a lot of manpower, time, or money is required for detailed defect detection.

When the defect detection of temporary equipment and materials is not performed appropriately, structural instability may occur in the work in construction sites utilizing such temporary equipment and materials, and work efficiency decreases inevitably.

In addition, even when a defect is detected, it is difficult to accurately detect the specific type of defect, so that it is not easy to determine measures to compensate for or deal with a defect.

Summary

An object of the present invention is to overcome the problems of the conventional technologies described above.

An object of the present invention is to enable the presence of a defect and the type of defect for equipment and materials to be determined in an easy way.

The objects of the present invention are not limited to the objects described above, and other objects not described above will be clearly understood from the following description.

According to an aspect of the present invention, there is provided a system for inspecting equipment and materials for quality, the system including: a magnetic sensor configured to generate a magnetic field in an inspection target object, and to detect magnetic flux density; and a quality inspection server configured to determine the presence of a defect, a portion where the detect is present, and the type of defect for the inspection target object based on magnetic flux density waveforms over a range from one end of the inspection target object to the other end thereof that are generated via signals detected by the magnetic sensor.

The quality inspection server may include a defect signal determination criteria setting unit configured to perform learning based on a machine learning algorithm by utilizing indexing information about the types of defects for respective magnetic flux density waveforms.

The quality inspection server may determine that a crack has occurred in a portion where one peak point appears when in the magnetic flux density waveforms, there is a region in which the magnitude of the magnetic flux density exceeds a first threshold value and there is only the corresponding one peak point in a waveform of the magnetic flux density which exceeds the first threshold value.

The quality inspection server may determine that corrosion has occurred in a region of the inspection target object where the magnetic flux density exceeding a second threshold value appears when in the magnetic flux density waveforms, there is a region in which the magnitude of the magnetic flux density exceeds a second threshold value and there is a plurality of peak points in a waveform of the magnetic flux density which exceeds the second threshold value.

The quality inspection server may calculate: when it is determined that a crack has occurred in the inspection target object, a crack score that is proportional to a slope value of a corresponding waveform, the maximum magnitude value of the magnetic flux density, and the width value of the region where the magnetic flux density exceeding a first threshold value appears, in the magnetic flux density waveforms; and, when it is determined that corrosion has occurred in the inspection target object, a corrosion score that is proportional to the width value of a region where magnetic flux density equal to or larger than a second threshold value appears and a difference value between the maximum value of the magnetic flux density and the second threshold value, in the magnetic flux density waveforms.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

Figure 1:
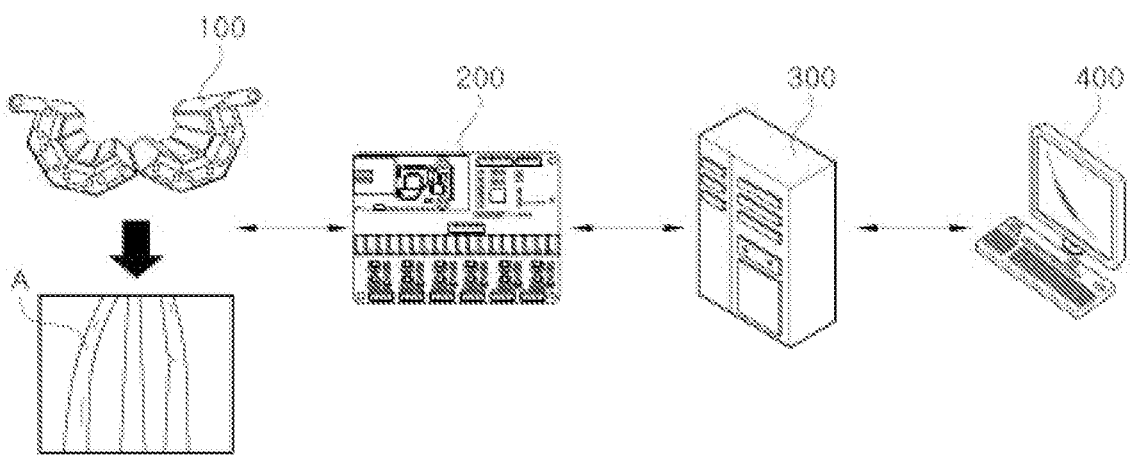
FIG. 1 is a view showing the schematic configuration of a system for inspecting equipment and materials for quality according to an embodiment of the present invention.

For the following detailed description of the present invention, reference is made to the accompanying drawings that show by way of illustration specific embodiments via which the present invention may be practiced. These embodiments will be described in sufficient detail to enable those skilled in the art to practice the present invention. It should be understood that various embodiments of the present invention are different but are not necessarily mutually exclusive. For example, a specific shape, structure, and/or feature described herein may be implemented as another embodiment without departing from the spirit and scope of the invention with respect to one embodiment. In addition, it should be understood that the locations or arrangement of individual components within each disclosed embodiment may be changed without departing from the spirit and scope of the present invention. Accordingly, the following detailed description is not intended to be taken in a limiting sense, and the scope of the present invention, together with all ranges equivalent to the appended claims if appropriately described, is limited only by the appended claims. Like reference numerals in the drawings refer to the same or similar functions throughout various aspects.

The embodiments of the present invention will be described in detail below with reference to the accompanying drawings so that those of ordinary skill in the art to which the present invention pertains can easily practice the present invention.

FIG. 1 is a view showing the schematic configuration of a system for inspecting equipment and materials for quality according to an embodiment of the present invention.

Referring to FIG. 1, the system for inspecting equipment and materials for quality according to the present embodiment may include a magnetic sensor 100, a signal collection device 200, a quality inspection server 300, and a user terminal 400.

The magnetic sensor 100, the signal collection device 200, the quality inspection server 300, and the user terminal 400 may communicate over an intercommunication network, e.g., a LoRa communication network, a mobile communication network, a local area network (LAN), a metropolitan area network (MAN), a wide area network (WAN), the World Wide Web (WWW), and/or a wireless fidelity (Wi-Fi) communication network.

The magnetic sensor 100 according to an embodiment serves to generate a magnetic field in an inspection target object, e.g., equipment or a material, and detect a magnetic flux density formed in the inspection target object and an area around the inspection target object due to the generated magnetic field.

To this end, the magnetic sensor 100 may include at least one magnetic field generation unit and at least one magnetic flux sensor.

According to an embodiment, an inspection target object A may generally be rod-shaped equipment or a rod-shaped material, e.g., rod-shaped temporary equipment or a rod-shaped material. In this case, at least one magnetic field generation unit provided in the magnetic sensor 100, e.g., a magnet, needs to generate a magnetic field while moving from one end of the inspection target object A to the other end thereof in the state of maintaining a predetermined distance to the surface of the inspection target object A.

To this end, the magnetic sensor 100 provided with the at least one magnetic field generation unit may be formed in a hollow shape. In this case, the inspection target object A, e.g., rod-shaped equipment or a rod-shaped material, may be passed through the central empty space of the magnetic sensor 100, and then the inspection of the equipment or material for quality may be performed.

The information detected by the magnetic sensor 100, i.e., information about a magnetic flux density for each piece of equipment or each material, is transmitted to the signal collection device 200. To this end, the magnetic sensor 100 may include an information transmission unit, and the signal collection device 200 may include a multi-channel signal reception unit capable of receiving information from a plurality of magnetic sensors 100.

The signal collection device 200 transmits collected information to the quality inspection server 300. Such a signal collecting device 200 may be provided, e.g., for each construction site, factory, or equipment and material quality inspection institution.

The quality inspection server 300 according to an embodiment performs the inspection of each piece of equipment or each material for quality based on the collected information. The quality inspection is performed based on the analysis of the measured magnetic flux characteristic of each piece of equipment or each material. Through this, the type of defect for each piece of equipment or each material may be determined. The analysis and determination may be performed based on a machine learning algorithm.

The user terminal 400 serves to receive information about the results of the analysis from the quality inspection server 300 and to display the information in a form that can be checked by an administrator. The user terminal 400 has a computation function, and may be implemented in any form as long as it is a device capable of communicating with the outside. For example, the user terminal 400 may be implemented as a smartphone, a tablet personal computer (PC), a desktop, a laptop, a notebook, a personal digital assistant (PDA), or the like, but is not limited thereto.

Figure 2:
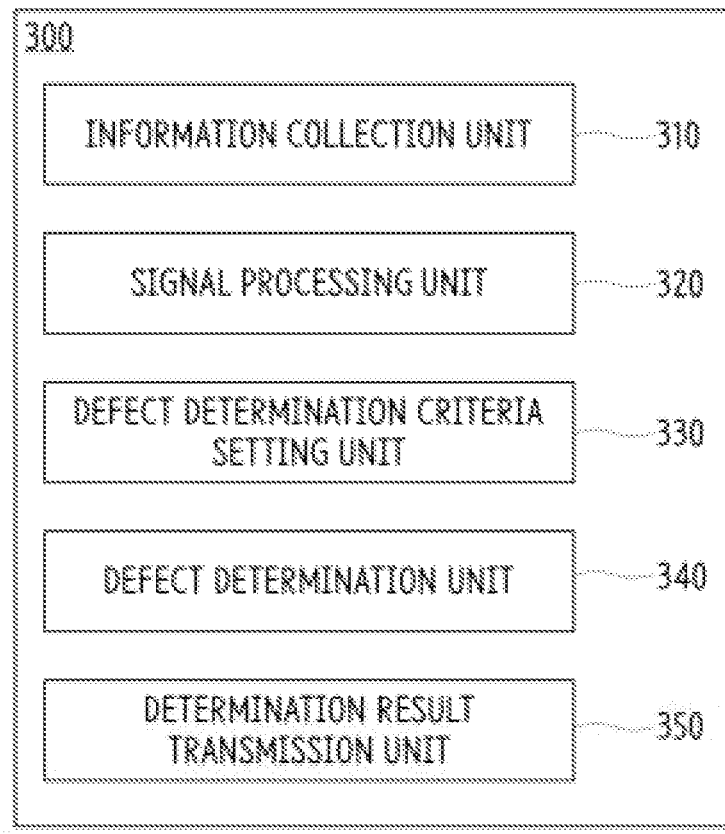
FIG. 2 is a block diagram illustrating the function and detailed configuration of a quality inspection server according to an embodiment of the present invention.

FIG. 2 is a block diagram illustrating the function and detailed configuration of a quality inspection server according to an embodiment of the present invention.

Referring to FIG. 2, the quality inspection server 300 may include an information collection unit 310, a signal processing unit 320, a defect determination criteria setting unit 330, a defect determination unit 340, and a determination result transmission unit 350.

The information collection unit 310, the signal processing unit 320, the defect determination criteria setting unit 330, the defect determination unit 340, and the determination result transmission unit 350 may be program modules or hardware capable of communicating with external devices. The program modules or hardware may be included in the quality inspection server 300 in the form of an operating system, application program modules, or other program modules, and may physically be stored in various types of known storage devices. Meanwhile, these program modules or hardware include, but are not limited to, routines, subroutines, programs, objects, components, and/or data structures that perform specific tasks to be described later or execute specific abstract data types according to the present invention.

The information collection unit 310 serves to receive information, i.e., magnetic flux density information about each piece of equipment or each material, detected by the magnetic sensor 100, through the signal collection device 200. Since it is necessary to identify an inspection target object for which each piece of received information has been detected, the received magnetic flux-related information may include the identification information of a corresponding inspection target object. Alternatively, the inspection sequence of inspection target objects may be stored in the quality inspection server 300 in advance, the information transmitted by the magnetic sensor 100 may sequentially be received, and then the pieces of magnetic flux-related information may be matched with the respective inspection target objects.

The signal processing unit 320 serves to process the signals collected by the information collection unit 320.

According to an embodiment, the magnetic flux-related information for each inspection target object may be a waveform representative of a magnetic flux density change pattern that the magnetic sensor 100 detects while moving from one end of the corresponding inspection target object, e.g., temporary equipment, a temporary material, or a steel rod, to the other end thereof.

In this case, the signal processing unit 320 may perform noise removal, drift correction, and offset correction in the corresponding waveform. The noise removal may be performed using a low-pass filter having preset parameters. The drift correction may be performed by moving a waveform by a predetermined range with respect to an axis when the reference point or start point of the waveform does not match a preset standard point. In addition, the offset correction may be performed in such a manner as to correct the origin of a waveform when the origin of the waveform received by the information collection unit 310 is incorrect. The operations performed by the signal processing unit 320 are not limited thereto, and various types of signal processing operations may be further added.

The defect determination criteria setting unit 330 serves to index the types of defects based on the signals processed by the signal processing unit 320, which are waveforms appearing for the respective types of inspection target objects, and then learn them, and also serves to set threshold values for the determination of the types of defects for respective waveforms.

First, the magnetic flux density detection results of inspection target objects, i.e., waveforms for magnetic flux density patterns obtained from the surfaces of the inspection target objects, are learned through a neural network structure. In this case, the process of inputting information about the types of defects of actual inspection target objects for respective waveforms, i.e., an indexing process, may also be performed.

The present invention adopts a learning method using a deep learning technique, which is a type of machine learning. Machine learning is a branch of artificial intelligence, and has evolved from studies of pattern recognition and computer learning theories.

Machine learning improves a knowledge base by using surrounding environments as training elements. A specific task is performed using the improved knowledge base, and the information obtained during the performance of the task is reflected in the training elements again. Machine learning is a technique that studies and constructs a system and algorithm for performing learning based on empirical data in the above manner, making predictions, and improving its own performance. Machine learning algorithms use a method of constructing a specific model to make a prediction or decision based on input data.

Machine learning may be classified into a method of rote learning and direct provision of new knowledge, a supervised learning method, a learning-by-analogy method, and an inductive learning method according to their learning strategies. The present invention may use at least one of the above learning methods.

Through the above-described learning, it may be possible to determine the presence of a defect and the type of defect in equipment or a material for each magnetic flux density pattern appearing in the equipment or the material.

Figure 3:
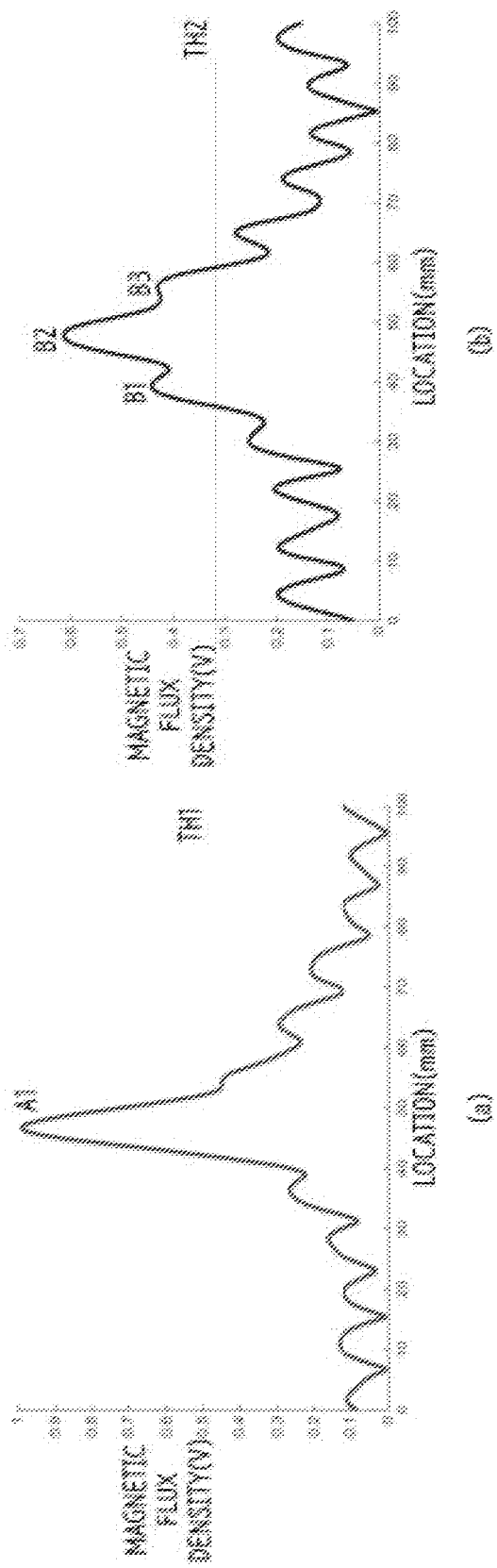
FIG. 3 shows examples of magnetic flux density waveforms appearing for the respective types of defects of equipment or materials according to an embodiment of the present invention.

FIG. 3 shows examples of magnetic flux density waveforms appearing for the respective types of defects of equipment or materials according to an embodiment of the present invention.

Referring to FIG. 3(*a*), when the magnitude of a waveform corresponding to a magnetic flux density pattern that the magnetic sensor 100 measures while moving from one end of equipment or a material to the other end thereof is not constant, there is a region in which the magnitude of a magnetic flux density exceeds a first threshold value TH1, and there is only one peak point A1 in the waveform of the magnetic flux density exceeding the first threshold value TH1, it may be determined that a crack has occurred in the portion where the corresponding peak point appears. Since the occurrence of a crack implies that a cross-sectional loss has occurred at a single point, only the single peak point P1 appears at the corresponding cracking point, as described above.

Referring to FIG. 3(*b*), when the magnitude of a waveform corresponding to a magnetic flux density pattern that the magnetic sensor 100 measures while moving from one end of equipment or a material to the other end thereof is not constant, there is a region in which the magnitude of a magnetic flux density exceeds a second threshold value TH2, and there is a plurality of peak points B1, B2, and B3 in the waveform of the magnetic flux density exceeding the second threshold value TH2, it may be determined that corrosion has occurred in the region of the inspection target object where the magnetic flux density exceeding the second threshold value TH2 appears.

Corrosion is caused by the rusting of the cross sections of an inspection target object, so that a cross section loss occurs over a wide range. Accordingly, a plurality of peak points occurs in a magnetic flux density waveform exceeding the second threshold value TH2 and the magnetic flux density rises at each of the cross-sectional loss points, with the result that the largest magnetic flux density appears in the central region of the region where corrosion occurs.

In the above description, the "peak point" refers to a point where a slope changes from a positive (+) value to a negative (−) value when a curve increases along a positive (+) slope and then decreases along a negative (−) slope in a magnetic flux density waveform. Furthermore, although the first threshold value TH1 and the second threshold value TH2 may be the same as each other, they may be different from each other.

Meanwhile, the defect determination criteria setting unit 330 may further serve to set threshold values for the determination of the respective types of defects, e.g., the first threshold value TH1 and the second threshold value TH2 in the above description, based on pieces of waveform pattern information for the respective types of defects learned through machine learning.

The defect determination criteria setting unit 330 may determine the presence of a defect and the type of defect for each magnetic flux density waveform via the threshold values set as described above, and may perform a learning operation thereon. However, only one of the learning via a machine learning algorithm and the operation of determining the presence of a defect and the defect type via the set threshold values may be performed.

Referring back to FIG. 2, the defect determination unit 340 serves to determine the presence of a defect and the type of defect for a received magnetic flux density waveform based on the results of the learning performed by the defect determination criteria setting unit 330 or the threshold values or the results of learning set by the combination determination criteria setting unit 330.

According to an embodiment, the defect determination unit 340 may serve to determine a defect present in a corresponding inspection target object for the magnetic flux density waveform information received by the information collection unit 310 and processed by the signal processing unit 320 based on the results of the learning performed by the defect determination criteria setting unit 330. Alternatively, the defect determination unit 340 may determine a defect based on corresponding received magnetic flux density waveform information with reference to the threshold values set by the defect determination criteria setting unit 330.

According to an embodiment, when there is only one peak point in a waveform exceeding the first threshold value TH1 among waveforms representing magnetic flux densities, the defect determination unit 340 may determine that a "crack" has occurred at the corresponding peak point. When there is a plurality of peak points in a waveform exceeding the second threshold value TH2, the defect determination unit 340 may determine that "corrosion" has occurred in a corresponding region.

In addition, in the cases of a "crack" and "corrosion", the degrees thereof may be determined as follows.

Figure 4:
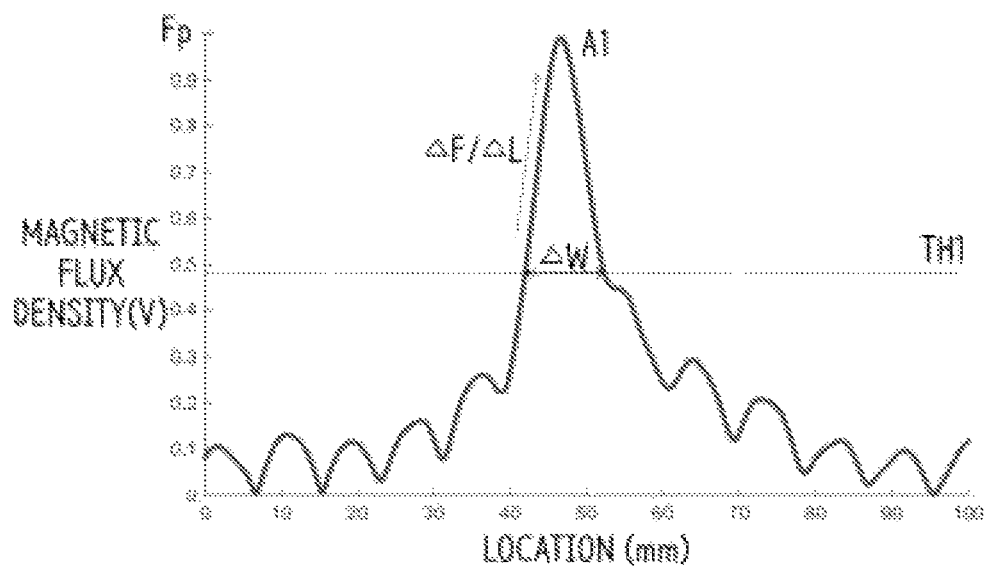
FIG. 4 is a view illustrating a method of calculating a crack score according to an embodiment of the present invention.

First, referring to FIG. 4, in the case of a crack, in a waveform exceeding the first threshold value TH1, the slope value $$\frac{\Delta F}{\Delta L}$$

of the waveform, i.e., a change value $\Delta F$ in the magnetic flux density with respect to a unit length $\Delta L$ in an inspection target object extending in the longitudinal direction, is proportional to the depth of the crack. Furthermore, the maximum magnitude value $F_p$ of the magnetic flux density is also proportional to the depth of the crack. Meanwhile, the width value $\Delta W$ of a region where magnetic flux density exceeding the first threshold value TH1 in the inspection target object appears is proportional to the width of the crack.

Accordingly, a crack score indicating the degree of crack may be represented as follows:

$$P1 = k1 \times \frac{\Delta F}{\Delta L} \times F_p \times \Delta W \quad (1)$$

where k1 is a constant.

Figure 5:
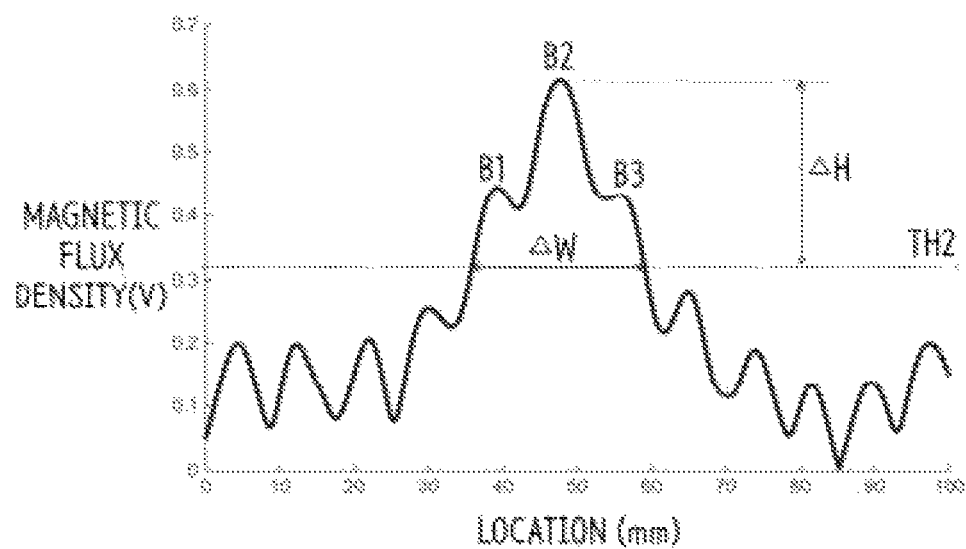
FIG. 5 is a view illustrating a method of calculating a corrosion score according to an embodiment of the present invention.

Meanwhile, referring to FIG. 5, in the case of corrosion, in a waveform exceeding the second threshold value TH2, the difference value $\Delta H$ between the maximum magnitude and the second threshold value TH2 is proportional to the degree of corrosion, and the width value $\Delta W$ of a region where magnetic flux density exceeding the second threshold value TH2 appears increases as the range of corrosion increases.

Accordingly, a corrosion score indicating the degree of corrosion may be represented as follows:

$$P2 = k2 \times \Delta H \times \Delta W \quad (2)$$

where k2 is a constant.

As described above, the defect determination unit 340 may calculate a crack score indicating the degree of crack or a corrosion score indicating the degree of corrosion through a magnetic flux density waveform for an inspection target object.

The determination result transmission unit 350 serves to transmit the results of the determination performed by the defect determination unit 340 to the user terminal 400. Furthermore, the determination result transmission unit 350 may transmit information about a magnetic flux density waveform processed by the signal processing unit 320, information about the results of the learning performed by the defect determination criteria setting unit 330, and information about set threshold values to the user terminal 400.

The identification information of an inspection target object to be determined and the defect-related determination information of the inspection target object may be transmitted together to the user terminal 400.

Via this information, an administrator may check, manage, and classify the quality of equipment or a material.

According to an embodiment, the presence or absence of a defect and the type of defect for equipment or a material may be determined in an easy way.

Furthermore, according to an embodiment, the presence or absence of a defect and the type of defect may be accurately determined through machine learning on the magnetic flux density patterns of inspection target objects.

The foregoing description of the present invention is intended for illustration purposes. It will be understood by those of ordinary skill in the art to which the present invention pertains that each of the embodiments described above may be easily modified into other specific forms without changing the technical spirit or essential features of the present invention. Accordingly, it should be understood that the embodiments described above are illustrative but not restrictive in all respects. For example, each component described as being in a single form may be implemented in a distributed form, and, likewise, components described as being in a distributed form may also be implemented in an integrated form.

The scope of the present invention is defined by the attached claims, and all variations or modifications derived from the meanings and scope of the claims and their equivalents should be construed as falling within the scope of the present invention.

What is claimed is:

1. A system for inspecting equipment and materials for quality, the system comprising:
a magnetic sensor configured to generate a magnetic field in an inspection target object passing through a central empty space of the magnetic sensor, and to detect magnetic flux density; and
a quality inspection server configured to determine a presence of a defect and a type of defect for the inspection target object based on magnetic flux density waveforms over a range from one end of the inspection target object to a remaining end thereof that are generated via signals detected by the magnetic sensor;
wherein the quality inspection server:

determines that a crack has occurred in a portion where one peak point appears in an area from the one end of the inspection target object to the remaining end thereof when in the magnetic flux density waveforms, there is a region in which a magnitude of the magnetic flux density exceeds a first threshold value and there is only the corresponding one peak point in a waveform of the magnetic flux density which exceeds the first threshold value; and determines that corrosion has occurred in a region of the inspection target object where the magnetic flux density exceeding a second threshold value appears in the area from the one end of the inspection target object to the remaining end thereof when in the magnetic flux density waveforms, there is a region in which a magnitude of the magnetic flux density exceeds the second threshold value and there is a plurality of peak points in a waveform of the magnetic flux density which exceeds the second threshold value;

wherein the peak point is a point where a slope changes from a positive (+) value to a negative (−) value when a curve increases along a positive (+) slope and then decreases along a negative (−) slope in a corresponding magnetic flux density waveform; and wherein the quality inspection server:

when it is determined that a crack has occurred in the inspection target object, calculates a crack score via the following equation:

$$P1 = k1 \times \Delta F / \Delta L \times F_p \times \Delta W$$

where P1 is the crack score, k1 is a constant, $\Delta L$ is a unit length, $\Delta F$ is a change value of the magnetic flux density, $F_p$ is a maximum magnitude value of the magnetic flux density, and $\Delta W$ is a width value of a region where magnetic flux density exceeding the first threshold value appears; and when it is determined that corrosion has occurred in the inspection target object, calculates a corrosion score via the following equation:

$$P2 = k2 \times \Delta H \times \Delta W$$

where P2 is the corrosion score, k2 is a constant, $\Delta H$ is a difference value between a maximum magnitude in a magnetic flux density waveform exceeding the second threshold value and the second threshold value, and $\Delta W$ is a width value of a region where magnetic flux density exceeding the second threshold value appears.

2. The system of claim 1, wherein the quality inspection server comprises a defect signal determination criteria setting unit configured to perform learning based on a machine learning algorithm by utilizing indexing information about types of defects for respective magnetic flux density waveforms.

* * * * *